United States Patent [19]
Takita et al.

[11] Patent Number: 6,114,089
[45] Date of Patent: Sep. 5, 2000

[54] POSITIVE WORKING PHOTOSENSITIVE LITHOGRAPHIC PRINTING PLATE

[75] Inventors: Satoshi Takita; Mitsuhiro Imaizumi; Keiji Akiyama; Seiji Uno; Shiro Tan, all of Shizuoka, Japan

[73] Assignee: Fuji Photo Film Co., Ltd., Minami-Ashigara, Japan

[21] Appl. No.: 09/055,969

[22] Filed: Apr. 7, 1998

[30] Foreign Application Priority Data

Apr. 8, 1997 [JP] Japan .................................. 9-089646
Sep. 29, 1997 [JP] Japan .................................. 9-264311

[51] Int. Cl.⁷ .................................................. G03C 1/77
[52] U.S. Cl. ..................................... 430/278.1; 430/276.1
[58] Field of Search .................................. 430/159, 160, 430/164, 166, 276.1, 278.1

[56] References Cited

U.S. PATENT DOCUMENTS

| | | | |
|---|---|---|---|
| 4,049,746 | 9/1977 | Muzyczko et al. | 260/851 |
| 4,539,285 | 9/1985 | Duyala et al. | 430/157 |
| 4,552,827 | 11/1985 | Eklund et al. | 430/160 |
| 4,842,988 | 6/1989 | Herrmann et al. | 430/14 |
| 4,956,261 | 9/1990 | Pawlowski et al. | 430/156 |
| 5,254,430 | 10/1993 | Nagashima et al. | 430/166 |
| 5,476,754 | 12/1995 | Imai et al. | 430/302 |
| 6,004,728 | 12/1999 | Deroover et al. | 430/302 |
| 6,017,677 | 1/2000 | Maemoto et al. | 430/270.1 |

FOREIGN PATENT DOCUMENTS

| | | |
|---|---|---|
| 0650094 | 4/1995 | European Pat. Off. . |
| 0727714 | 8/1996 | European Pat. Off. . |
| 4105887 | 9/1991 | Germany . |
| 4023268 | 1/1992 | Germany . |
| 411038629 | 2/1999 | Japan . |

OTHER PUBLICATIONS

Patent Abstracts of Japan, vol. 16, No. 28 (P–1302), Jan. 23, 1992 & JP 03240060 A (Fuji Photo Film Co.), Oct. 25, 1991 *Abstract*.

Database WPI, Section Ch, Week 9211, Derwent Publications Ltd., London, GB; Class A89, AN 92–083815 XP002097676 & JP 04025845 A (Fuji Photo Film Co., Ltd.), Jan. 29, 1992 *Abstract*.

*Primary Examiner*—Janet Baxter
*Assistant Examiner*—Barbara Gilmore
*Attorney, Agent, or Firm*—Burns, Doane, Swecker & Mathis, LLP

[57] ABSTRACT

A positive working photosensitive lithographic printing plate comprising an aluminum substrate and a positive working photosensitive layer, the aluminum substrate having been anodized and rendered water-wettable, wherein an intermediate layer containing a polymer comprising (A) a unit interacting with an alumina layer and (B) a unit interacting with a water-wettable layer is provided between the aluminum substrate and the photosensitive layer. The photosensitive layer and the water-wettable aluminum substrate have good adhesion so that the printing plate has a satisfactory press life.

2 Claims, No Drawings

POSITIVE WORKING PHOTOSENSITIVE LITHOGRAPHIC PRINTING PLATE

FIELD OF THE INVENTION

The present invention relates to a photosensitive lithographic printing plate. More particularly, it relates to a positive working photosensitive lithographic printing plate.

BACKGROUND OF THE INVENTION

Widely spread positive working photosensitive lithographic printing plates comprise an aluminum substrate having thereon a positive working photosensitive layer containing an o-quinonediazide compound, in which the aluminum substrate has been subjected to surface graining, alkali etching or anodizing. The o-quinonediazide compound is known to be changeable to a corresponding carboxylic acid on exposure to ultraviolet light (hereafter referred to as "UV" for simplicity). After UV exposure, the photosensitive layer in only the UV-exposed area is dissolved away with an aqueous alkali solution to expose the substrate, leaving the lipophilic photosensitive layer on the unexposed area to form an ink-receptive image area. The UV-exposed area (non-image area) where a hydrophilic (water-wettable) surface of the substrate is exposed is to retain water to provide an ink-repellant area.

Because the aluminum substrate surface has insufficient water wettability, i.e., ink repellency, printing ink adheres thereto to stain the non-image area. In order to improve the stain resistance of the aluminum substrate, it is generally necessary to make the non-image area water-wettable. If a substrate is made water-wettable before a positive working photosensitive layer is provided thereon, the resulting printing plate will have a reduced press life (the number of satisfactory prints obtainable) on account of poor adhesion between the hydrophilic substrate and the lipophilic photosensitive layer. Therefore, it has been a generally followed practice that only the non-image area is rendered water-wettable by using a developer containing a silicate, such as sodium silicate or potassium silicate, at the time of plate development.

However, the silicate-containing developer precipitates solids derived from $SiO_2$, or the waste of the developer forms gel derived from $SiO_2$ on neutralization. As a result, solid matter mainly comprising silicates formed in a processing tank or pipes of an automatic processing machine tends to cause a sensor to operate incorrectly or clog the pipes. It has therefore been demanded to develop a technique for providing a positive working photosensitive layer on a substrate having been previously made water-wettable with good adhesion thereby producing a printing plate having a satisfactory press life.

In order to overcome the above-described problems, U.S. Pat. No. 3,136,636 proposes providing an intermediate layer of a water-soluble polymer, such as polyacrylic acid or carboxymethyl hydroxyethyl cellulose, but the impression capacity (press life) of the resulting plate is still unsatisfactory. U.S. Pat. No. 4,483,913 teaches providing an intermediate layer comprising a quaternary ammonium compound, such as poly(dimethyldiallylammonium chloride), but the resulting plate is unsatisfactory due to insufficient stain resistance.

It has also been pointed out that a positive working lithographic printing plate precursor comprising a substrate having been previously made water-wettable and a positive working photosensitive layer does not have sufficient deletion properties (ease in deleting the unnecessary image area with a so-called deletion fluid after development), and improvement in this respect has been desired. Further, the plate precursor tends to suffer from color remaining (the phenomenon that dyes present in the photosensitive layer remain on the substrate in the non-image area after development) or tends to have insufficient print-out properties (an ability of providing a difference of optical density between an exposed area and an unexposed area before development), and improvements in these respects have also been demanded.

SUMMARY OF THE INVENTION

One object of the present invention is to provide a positive working photosensitive lithographic printing plate having improved stain resistance and an improved press life.

Another object of the present invention is to provide a positive working photosensitive lithographic printing plate which is satisfactory in deletion properties, freedom from color remaining, print-out properties, and chemical resistance (expressed by the number of satisfactory prints obtained by printing while wiping the image areas with a plate cleaner).

A further object of the present invention is to provide a positive working photosensitive lithographic printing plate which is satisfactory in stain resistance, press life, deletion properties, freedom from color remaining, print-out properties, and chemical resistance even when the precursor thereof is developed with a developer containing no silicate.

As a result of extensive study, the inventors have found that the above objects are accomplished by a positive working photosensitive lithographic printing plate comprising an aluminum substrate and a positive working photosensitive layer, the aluminum substrate having been anodized and rendered water-wettable and thereby having on its surface an alumina layer and a water-wettable layer, wherein an intermediate layer containing a polymer comprising (A) a unit interacting with the alumina layer and (B) a unit interacting with the water-wettable layer is provided between the aluminum substrate and the photosensitive layer.

In conventional techniques, a printing plate produced by forming a photosensitive layer on an aluminum substrate having been made water-wettable by treatment with, for example, a silicate, has a considerably short press life due to poor adhesion between the water-wettable aluminum substrate and the photosensitive layer. According to the present invention, improved adhesion is exerted in the image area, leading to markedly improved press life and chemical resistance, by providing an intermediate layer containing the above-described specific polymer. Since the polymer has affinity to an alkaline developer, the polymer on the non-image area is easily removed from the substrate by development processing to expose the water-wettable surface of the substrate so that the resulting plate exhibits satisfactory stain resistance. Because a processing solution containing a silicate is not always required, the problems arising from $SiO_2$ (incorrect operation of sensors or clogging of pipes due to solid matter mainly comprising silicates) are eliminated, and necessity of such tedious operations as cleaning or exchanging is excluded. In addition, the plate precursor surprisingly exhibits satisfactory print-out properties after exposure and extremely satisfactory deletion properties and freedom from color remaining after development.

DETAILED DESCRIPTION OF THE INVENTION

The polymer which can be used in the intermediate layer comprises (A) a unit interacting with an alumina layer (hereinafter referred to as "unit A") and (B) a unit interacting with a water-wettable layer (hereinafter referred to as "unit B").

Unit A that interacts with an alumina layer is a unit derived from a monomer having an Rf value of not more than 0.5, and preferably not more than 0.2, in thin layer chromatography (TLC) using an immobile phase mainly comprising alumina and methanol as a developing solution and being capable of copolymerizing with the following monomer to provide a polymer (hereinafter referred to as "monomer A"). Unit B that interacts with a water-wettable layer is a unit derived from a monomer having an Rf value of not more than 0.5, and preferably not more than 0.2 in TLC using an immobile phase mainly comprising silica and methanol as a developing solution and being capable of copolymerizing with monomer A to form a polymer (hereinafter referred to as "monomer B").

The polymer preferably includes addition polymers of vinyl monomers such as acrylic resins, methacrylic resins and polystyrene, or polyaddition polymers or polycondensation polymers such as urethane resins, polyester, and polyamide. Addition polymers of vinyl monomers are preferred.

More preferred are those obtained by copolymerizing monomer A represented by formula (I) or (II) (given later) and monomer B represented by formula (III), (IV) or (V) (given later).

Monomer A is selected from a monomer having an acid radical, a monomer having an alkyleneoxy group, a monomer having an onium group, and the like.

The acid radical in monomer A preferably includes one having an acid dissociation constant (pKa) of not higher than 7, still preferably —COOH, —SO$_3$H, —OSO$_3$H, —PO$_3$H$_2$, —OPO$_3$H$_2$, —CONHSO$_2$—, and —SO$_2$NHSO$_2$—, particularly preferably —COOH.

Particularly preferred monomer A having such an acid radical is represented by formula (I) or (II):

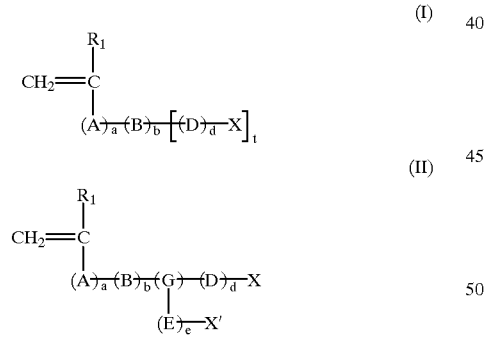

wherein A represents a divalent linking group; B represents an aromatic group or a substituted aromatic group; D and E each represent a divalent linking group; G represents a trivalent linking group; X and X' each represent an acid radical having a pKa of 7 or smaller or an alkali metal or ammonium salt thereof; R$_1$ represents a hydrogen atom, an alkyl group or a halogen atom; a, b, d, and e each represent 0 or 1; and t represents an integer of 1 to 3.

In formulae (I) and (II), A is preferably —COO— or —CONH—; B is preferably a phenylene group or a phenylene group substituted with a hydroxyl group, a halogen atom or an alkyl group; D and E each preferably represent an alkylene group or a divalent linking group represented by formula C$_n$H$_{2n}$O, C$_n$H$_{2n}$S or C$_n$H$_{2n+1}$N; G is preferably a trivalent linking group represented by formula C$_n$H$_{2n-1}$, C$_n$H$_{2n-1}$O, C$_n$H$_{2n-1}$S or C$_n$H$_{2n}$N (wherein n represents an integer of 1 to 12); X and X' are each preferably a carboxyl group, a sulfo group, a phospho group, a sulfuric monoester group or a phosphoric monoester group; R$_1$ is preferably a hydrogen atom or an alkyl group; and it is preferred that a and b, which are each 0 or 1, be not 0 at the same time.

Of monomers A having an acid radical, those of formula (I) in which B is a phenylene group or a phenylene group substituted with a hydroxyl group or an alkyl group having 1 to 3 carbon atoms; D represents an alkylene group having 1 or 2 carbon atoms or an alkyleneoxy group having 1 or 2 carbon atoms; R$_1$ is a hydrogen atom or a methyl group; X is a carboxyl group; a is 0; and b is 1.

Specific but non-limiting examples of monomer A having an acid radical are shown below together with their Rf value.

Acrylic acid (Rf: 0.09)
Methacrylic acid (Rf: 0.09)
Maleic acid (Rf: 0.00)

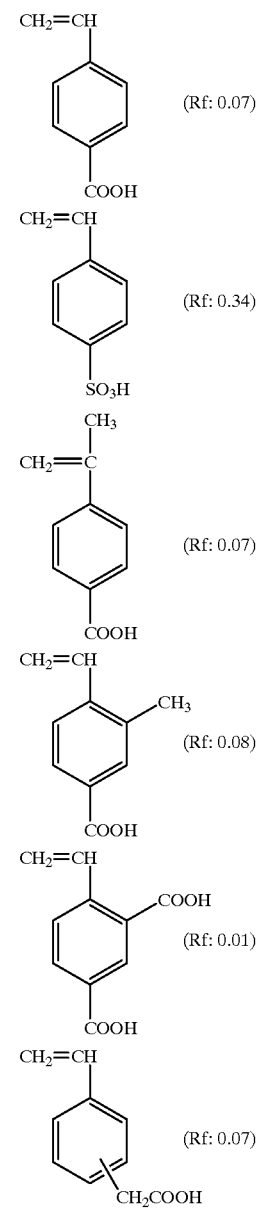

-continued

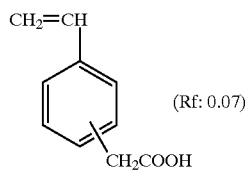 (Rf: 0.07)

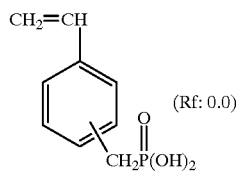 (Rf: 0.0)

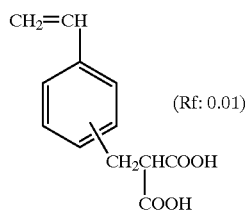 (Rf: 0.01)

Useful monomer (A) further includes:

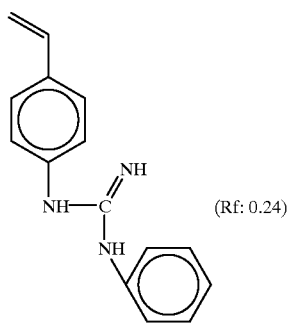 (Rf: 0.24)

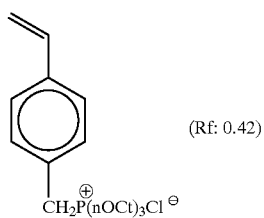 (Rf: 0.42)

Monomer B is appropriately selected from a monomer having an onium group, a monomer having an alkyleneoxy group, and the like.

Monomer (B) having an onium group typically includes those represented by formula (III), (IV) or (V):

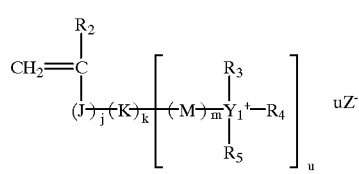 (III)

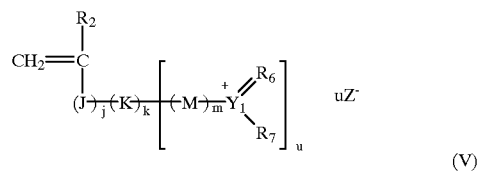 (IV)

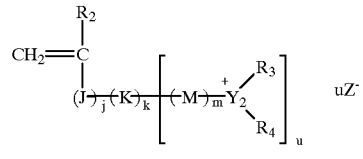 (V)

wherein J represents a divalent linking group; K represents an aromatic group or a substituted aromatic group; M or M's each represent a divalent linking group; $Y_1$ represents an atom of the group V of the Periodic Table; $Y_2$ represents an atom of the group VI of the Periodic Table; $Z^{-1}$ represents a counter anion; $R_2$ represents a hydrogen atom, an alkyl group or a halogen atom; $R_3$, $R_4$, $R_5$, and $R_7$ each represent a hydrogen atom, a substituted or unsubstituted alkyl group, a substituted or unsubstituted aromatic group or a substituted or unsubstituted aralkyl group; $R_6$ represents an alkylidene group or a substituted alkylidene group; $R_3$ and $R_4$, or $R_6$ and $R_7$ may be taken together to form a ring; j, k, and m each represent 0 or 1; and u represents an integer of 1 to 3.

Of monomers B having an onium group, preferred are those of formulae (III) to (V) in which J is —COO— or —CONH—; K is a phenylene group or a phenylene group substituted with a hydroxyl group, a halogen atom or an alkyl group; M is an alkylene group or a divalent linking group represented by formula $C_nH_{2n}O$, $C_nH_{2n}S$ or $C_nH_{2n+1}N$ (wherein n is an integer of 1 to 12); $Y_1$ is a nitrogen atom or a phosphorus atom; $Y_2$ is a sulfur atom; $Z^-$ is a halide ion, $PF_6^-$, $BF_4^-$ or $R_8SO_3^-$; $R_2$ is a hydrogen atom or an alkyl group; $R_3$, $R_4$, $R_5$, and $R_7$ are each a hydrogen atom, a substituted or unsubstituted alkyl group having 1 to 10 carbon atoms, a substituted or unsubstituted aromatic group or a substituted or unsubstituted aralkyl group; $R_6$ is a substituted or unsubstituted alkylidene group having 1 to 10 carbon atoms; $R_3$ and $R_4$, or $R_6$ and $R_7$ may be taken together to form a ring; and j, k, and m are each 0 or 1; provided that j and k do not simultaneously represent 0.

Particularly preferred are those of formulae (III) to (V) in which K is a phenylene group or a phenylene group substituted with an alkyl group having 1 to 3 carbon atoms; M is an alkylene group having 1 or 2 carbon atoms or an alkyleneoxy group having 1 or 2 carbon atoms; $Z^{-1}$ is a chloride ion or $R_8SO_3^-$; $R_2$ is a hydrogen atom or a methyl group; j is 0; and k is 1.

Specific but non-limiting examples of monomer B having an onium group are shown below together with their Rf value.

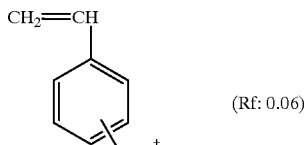 (Rf: 0.06)

 (Rf: 0.07)

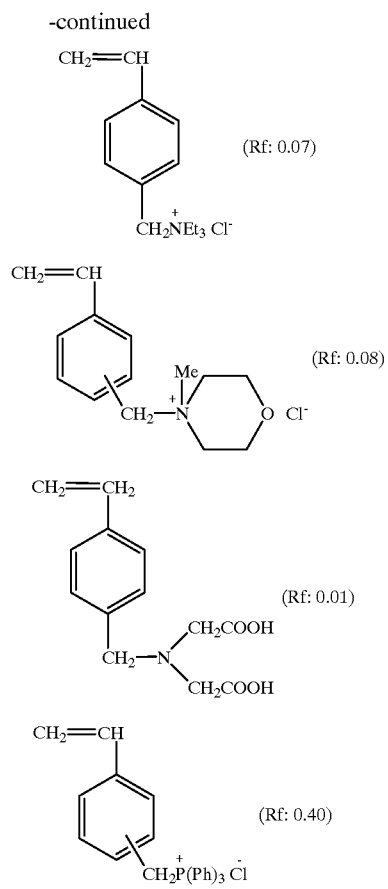

Monomer B further includes compounds having a 4-crown ether group or a 6-crown ether group.

It is desirable that the polymer which can be used in the intermediate layer comprises 5 mol % or more, preferably 10 mol % or more, and more preferably 15 to 95 mol %, of unit A and 1 mol % or more, preferably 5 mol % or more, and more preferably 5 to 85 mol %, of unit B. Where the unit A content is 5 mol % or more, removability in development with an alkali is further accelerated. Where the unit B content is 1 mol % or more, the improvement in adhesion is further improved due to synergistic effects in cooperation with unit A.

The polymer can comprise two or more kinds of unit A and two or more kinds of unit B. The intermediate layer can contain two or more polymers different in kind of unit A or B, copolymerization ratio of units A and B, or molecular weight.

Typical examples of the polymer are shown below. The copolymerization ratios are given by molar percentage.

| | Structure | Molecular weight (Mw) |
|---|---|---|
| No. 1 | —(CH₂—CH)₈₃— —(CH₂—CH)₁₇— / C₆H₄-COOH / C₆H₄-CH₂N⁺Me₃ Cl⁻ | 32,000 |
| No. 2 | —(CH₂—CH)₈₅— —(CH₂—CH)₁₅— / C₆H₄-COOH / C₆H₄-CH₂N⁺Et₃ Cl⁻ | 28,000 |
| No. 3 | —(CH₂—CH)₇₃— —(CH₂—CH)₂₇— / C₆H₄-COOH / C₆H₄-CH₂-N⁺(Me)(morpholine) Cl⁻ | 26,000 |

-continued

| | Structure | Molecular weight (Mw) |
|---|---|---|
| No. 4 | -(CH₂-CH)₆₄-(C₆H₄-COOH)  -(CH₂-CH)₃₆-(C₆H₄-CH₂-N⁺(pyridine) Cl⁻) | 41,000 |
| No. 5 | -(CH₂-CH)₇₆-(C₆H₄-COOH)  -(CH₂-CH)₂₄-(C₆H₄-CH₂N⁺(CH₂CH₂OH)₃ Cl⁻) | 11,000 |
| No. 6 | -(CH₂-CH)₈₈-(C₆H₄-COOH)  -(CH₂-CH)₁₂-(C₆H₄-CH₂P⁺(n-Bu)₃ Cl⁻) | 17,000 |
| No. 7 | -(CH₂-CH)₅₈-(C₆H₄-SO₃H)  -(CH₂-CH)₄₂-(C₆H₄-CH₂P⁺(n-Bu)₃ Cl⁻) | 36,000 |
| No. 8 | -(CH₂-CH)₇₃-(C₆H₄-SO₃H)  -(CH₂-CH)₂₇-(C₆H₄-CH₂N⁺Et₃ Cl⁻) | 22,000 |
| No. 9 | -(CH₂-CH)₅₁-(C₆H₄-CH₂P(=O)(OH)₂)  -(CH₂-CH)₃₆-(C₆H₄-CH₂-N⁺(pyridine) Cl⁻) | 44,000 |
| No. 10 | -(CH₂-CH)₅₁-(C₆H₄-CH₂P(=O)(OH)₂)  -(CH₂-CH)₄₉-(C₆H₄-CH₂N⁺Et₃ Cl⁻) | 19,000 |

-continued
| | Structure | Molecular weight (Mw) |
|---|---|---|
| No. 11 | 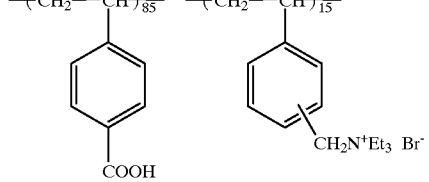 | 28,000 |
| No. 12 | 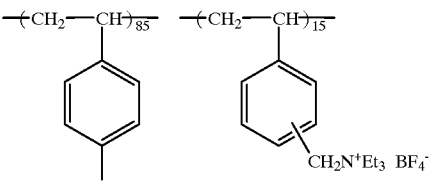 | 28,000 |
| No. 13 | 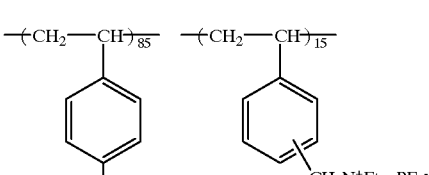 | 28,000 |
| No. 14 | 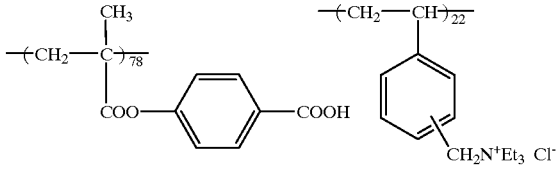 | 34,000 |
| No. 15 | 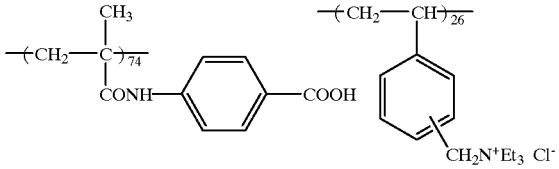 | 42,000 |
| No. 16 | 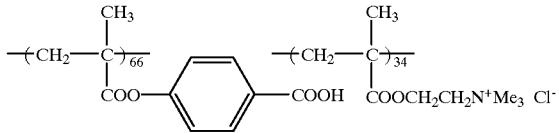 | 13,000 |
| No. 17 | 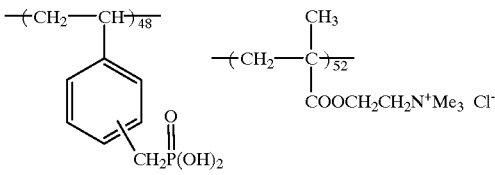 | 15,000 |
| No. 18 | 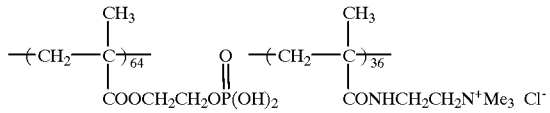 | 46,000 |

-continued

| | Structure | Molecular weight (Mw) |
|---|---|---|
| No. 19 | −(CH₂−C(CH₃))₇₂−⌬−COO−C₆H₄−COOH  −(CH₂−C(CH₃))₂₈−COOCH₂CH₂N⁺HMe₂ Cl⁻ | 34,000 |
| No. 20 | −(CH₂−C(CH₃))₆₃−COOH  −(CH₂−CH)₃₇−C₆H₄−CH₂N⁺Et₃ Cl⁻ | 63,000 |
| No. 21 | −(CH₂−CH)₇₂−C₆H₄−COOH  −(CH₂−C(CH₃))₂₈−CONHCH₂CH(OH)CH₂N⁺Me₃ Cl⁻ | 25,000 |
| No. 22 | −(CH₂−C(CH₃))₈₂−CONH−C₆H₄−COOH  −(CH₂−C(CH₃))₁₈−CONHCH₂CH(OH)CH₂N⁺Me₃ Cl⁻ | 25,000 |
| No. 23 | −(CH₂−CH)₇₃−C₆H₄−SO₂NHCO−C₆H₄−CH₃  −(CH₂−CH)₂₇−C₆H₄−CH₂N⁺Me₃ Cl⁻ | 33,000 |
| No. 24 | −(CH₂−C(CH₃))₆₆−CONHSO₂−C₆H₄−CH₃  −(CH₂−CH)₃₄−C₆H₄−CH₂−N⁺(pyridinium) Cl⁻ | 41,000 |
| No. 25 | −(CH₂−CH)₈₁−C₆H₄−SO₂NHSO₂−C₆H₅  −(CH₂−CH)₁₉−C₆H₄−CH₂−N⁺(pyridinium) Cl⁻ | 14,000 |

-continued

| Structure | Molecular weight (Mw) |
|---|---|
| No. 26  $-(CH_2-CH)_{75}-$ with $CONH-C(CH_3)_2-CH_2-SO_3H$ ; $-(CH_2-CH)_{25}-$ phenyl-$CH_2N^+Et_3$ $Cl^-$ | 22,000 |
| No. 27  $-(CH_2-CH)_{65}-$ (4-COOH phenyl); $-(CH_2-CH)_{24}-$ (phenyl-$CH_2N^+Et_3$ $Cl^-$); $-(CH_2-C(CH_3))_{11}-COOCH_2CH_2OH$ | 23,000 |
| No. 28  $-(CH_2-CH)_{72}-$ (4-COOH phenyl); $-(CH_2-CH)_{23}-$ (phenyl-$CH_2N^+Et_3$ $Cl^-$); $-(CH_2-C(CH_3))_5-COOCH_3$ | 47,000 |

The polymer is usually prepared by radical successive polymerization (see F. W. Billmeyer, *Textbook of Polymer Science*, 3rd Ed., A Wiley-Interscience Publication (1984)).

While the polymer can have a broad range of molecular weight, it is preferred for the polymer to have a weight average molecular weight (Mw) of 500 to 2,000,000, particularly 2,000 to 600,000, as measured by a light scattering method. While the unreacted monomer content of the polymer can range widely, it is preferably not more than 20% by weight, particularly not more than 10% by weight.

A Synthesis Example of the polymer is described below.

SYNTHESIS EXAMPLE

Synthesis of p-Vinylbenzoic acid-Vinylbenzyltrimethylammonium Chloride Copolymer (No. 1):

In a 1 liter three-necked flask were put 146.9 g (0.99 mol) of p-vinylbenzoic acid (available from Hokko Chemical Industry Co., Ltd.), 44.2 g (0.21 mol) of vinylbenzyltrimethylammonium chloride, and 446 g of 2-methoxyethanol, and the resulting mixture was heated to 75° C. while stirring in a nitrogen stream. Then, 2.76 g (12 mmol) of dimethyl 2,2-azobis(isobutyrate) was added to the mixture kept at 75° C., and the stirring was continued. After stirring for 2 hours, 2.76 g (12 mmol) of dimethyl 2,2-azobis(isobutyrate) was added, and the stirring was continued. After 2 hours, 2.76 g (12 mmol) of dimethyl 2,2-azobis(isobutyrate) was added thereto, and the stirring was further continued for an additional 2 hour period. After allowing to cool to room temperature, the reaction mixture was poured into 12 liters of ethyl acetate while stirring. The precipitated solid was collected by filtration and dried to obtain 189.5 g of a solid product. The product was found to have a weight average molecular weight (Mw) of 32,000 as measured by a light scattering method.

Other polymers for use in the present invention can be synthesized similarly.

The intermediate layer containing the polymer is formed on an aluminum plate having been rendered water-wettable as hereinafter described by various methods. For example, the polymer is dissolved in an organic solvent (e.g., methanol, ethanol, methyl ethyl ketone) or a mixture of such organic solvents or a mixture of such organic solvents and water, and the solution is applied to an aluminum plate and dried. Alternatively, an aluminum plate is dipped in the polymer solution to adsorb the polymer, followed by washing with, e.g., water and dried to form an organic intermediate layer. In the former method, the concentration of the polymer in the coating solution is 0.005 to 10% by weight. The solution is applied by various coating methods, such as bar coating, spin coating, spray coating, curtain coating, and the like. In the latter method, the concentration of the polymer in the dipping solution is 0.01 to 20% by weight, and preferably 0.05 to 5% by weight, and the dipping is carried out at a liquid temperature of 20 to 90° C., and preferably 25 to 50° C., for 0.1 second to 20 minutes, and preferably 2 seconds to 1 minute.

The polymer solution can be adjusted to a pH of 0 to 12, and preferably 0 to 5, with basic substances, such as ammonia, triethylamine and potassium hydroxide; organic acidic substances, such as inorganic acids, e.g., hydrochloric acid, phosphoric acid, sulfuric acid, and nitric acid, organic sulfonic acids, e.g., nitrobenzenesulfonic acid and naphthalenesulfonic acid, organic phosphonic acids, e.g., phenylphosphonic acid, and organic carboxylic acids, e.g., benzoic acid, coumaric acid, and malic acid; and organic acid chlorides, such as naphthalenesulfonyl chloride and benzenesulfonyl chloride. The polymer solution can contain a yellow dye to improve tone reproducibility of the photosensitive lithographic printing plate.

The dry coating weight of the polymer is suitably 2 to 100 mg/m², and preferably 5 to 50 mg/m². At a dry coating weight less than 2 mg/m² or more than 100 mg/m², sufficient effects cannot be obtained.

The positive working photosensitive lithographic printing plate of the present invention is explained in detail in the order of (1) aluminum plate, (2) photosensitive composition and (3) development treatment. In the present invention, the photosensitive lithographic printing plate is often referred to as a "PS plate".

(1) Support

The support used in the positive working lithographic printing plate of the present invention and the treatment thereof are explained below.

[Aluminum plate]

The aluminum plate which can be used as a substrate in the present invention is a plate of pure aluminum or an aluminum alloy containing a trace of, e.g., 10% by weight or less of, hetero atoms, such as silicon, iron, manganese, copper, magnesium, chromium, zinc, bismuth, nickel, and titanium. Pure aluminum is preferred. Since 100% pure aluminum is difficult to produce with the state-of-the-art refining techniques, aluminum with a minimized hetero atom content is preferably used. In practice, aluminum alloys having about 10% by weight or less as described above may be seen as useful in the present invention. In other words, the aluminum plate used in the present invention is not particularly limited in its composition, and well-known and commonly used materials can be made use of. Preferred materials include JIS A 1050, 1100, 1200, 3003, 3103, and 3005. The aluminum plate used in the present invention is about 0.1 to 0.6 mm in thickness. If necessary, the aluminum plate is degreased with, e.g., a surface active agent or an aqueous alkali solution, to remove a rolling oil on the surface prior to surface graining.

[Surface graining treatment and anodizing treatment]

The surface of the aluminum plate is grained mechanically, electrochemically or chemically. Mechanical surface graining includes ball graining, brush graining, blast graining, and buff graining. Electrochemical graining (electrochemical dissolution of the substrate surface) is carried out in an electrolytic solution containing hydrochloric acid or nitric acid with an alternating or direct current. Mechanical graining and electrochemical graining can be used in combination as taught in JP-A-54-63902 (the term "JP-A" as used herein means an "unexamined published Japanese patent application").

If desired, the grained aluminum plate is subjected to etching with an alkali and neutralization. The plate is then anodized to acquire increased water-wettability and wear resistance. The electrolyte to be used in anodizing can be anything capable of forming a porous oxide layer, usually sulfuric acid, phosphoric acid, oxalic acid, chromic acid or a mixture thereof. The electrolyte concentration depends on the kind.

Being variable according to the kind of the electrolyte, anodizing conditions are not generally specified. Anodizing is usually carried out at an electrolyte concentration of 1 to 80% by weight, a liquid temperature of 5 to 70° C., a current density of 5 to 60 A/dm², a voltage of 1 to 100 V, and for an electrolysis time of 10 seconds to 5 minutes.

The anodized layer is preferably formed to an amount of 1.0 g/m² or more, particularly 2.0 to 6.0 g/m². If the amount of the anodized layer is less than 1.0 g/m², the resulting lithographic printing plate tends to have an insufficient press life or easily receives scratches on its non-image area, to which ink adheres.

While the anodizing treatment is applied to the printing side of a lithographic plate, an anodized layer having a weight of 0.01 to 3 g/m² is usually formed on the back side, too, because lines of electric force go round to the back side.

[Water-wettable treatment]

The anodized aluminum plate is then rendered water-wettable by conventional treatments, such as a treatment with an alkali metal silicate (e.g., an aqueous solution of sodium silicate) as disclosed in U.S. Pat. Nos. 2,714,066, 3,181,461, 3,280,734, and 3,902,734, in which a substrate is immersed or electrolyzed in a sodium silicate aqueous solution; a treatment with potassium fluorozirconate as disclosed in JP-B-36-22063 (the term "JP-B" as used herein means an "examined published Japanese patent application"); and a treatment with polyvinylphosphonic acid as proposed in U.S. Pat. Nos. 3,276,868, 4,153,461, and 4,689,272. The treatment with a silicate is particularly preferred in the present invention.

[Silicate treatment]

The silicate treatment is carried out by immersing the anodized layer of the aluminum plate in an alkali metal silicate aqueous solution having a concentration of 0.001 to 30% by weight, preferably 0.005 to 10% by weight, and a pH of 10 to 13 (at 25° C.) at a prescribed liquid temperature for a prescribed time, for example at 15 to 80° C. for 0.5 to 120 seconds. If the pH of the solution is lower than 10, the solution gels. If the pH is higher than 3.0, the anodized layer will be dissolved. Suitable alkali metal silicates include sodium silicate, potassium silicate, and lithium silicate. In order to increase the pH of the solution, hydroxides, such as sodium hydroxide, potassium hydroxide and lithium hydroxide, can be added. The treating solution can contain an alkaline earth metal salt or a salt of the group IVB metal. The alkaline earth metal salt includes nitrates, such as calcium nitrate, strontium nitrate, magnesium nitrate, and barium nitrate; and water-soluble salts, such as a sulfate, a hydrochloride, a phosphate, an acetate, an oxalate and a borate. The salt of the group IVB metal includes titanium tetrachloride, titanium trichloride, potassium titanium fluoride, potassium titanium oxalate, titanium sulfate, titanium tetraiodide, zirconium oxychloride, zirconium dioxide, and zirconium tetrachloride. The alkaline earth metal salts and the group IVB metal salts may be used either individually or as a combination of two or more thereof. The metal salt is added in an amount of preferably from 0.01 to 10% by weight, and more preferably of from 0.05 to 5.0% by weight, based on the treating solution. The silicate-treated aluminum plate has particularly improved water-wettability to provide non-image areas to which ink hardly adheres, i.e., non-image areas with improved stain resistance.

[Backcoat]

If desired, a backcoat is provided on the back side of the substrate. The backcoat preferably comprises the organic polymeric compound described in JP-A-5-45885 or the metal oxide described in JP-A-6-35174 which is obtained by hydrolyzing an organic or inorganic metal compound, followed by polycondensation. Of these backcoating substances, metal oxides prepared from silicon alkoxides, such as $Si(OCH_3)_4$, $Si(OC_2H_5)_4$, $Si(OC_3H_7)_4$, and $Si(OC_4H_9)_4$, are particularly preferred for their high resistance against development processing and inexpensiveness and availability of the starting silicon alkoxides.

(2) Photosensitive composition

The photosensitive composition used in the positive working photosensitive lithographic printing plate of the present invention is described in detail below.

The positive working photosensitive layer of the lithographic plate is prepared from a photosensitive composition.

Any photosensitive composition that changes its solubility or swellability in or with a developing solution upon being exposed to light is useful. Typical examples of useful photosensitive compositions will be described below for illustrative purposes only but not for limitation.

Photosensitive compounds used in the photosensitive composition include o-quinonediazide compounds, such as o-naphthoquinonediazide compounds. The o-naphthoquinonediazide compounds preferably include an ester of a 1,2-diazonaphthoquinonesulfonyl chloride and a pyrogallol-acetone resin which is described in JP-B-43-28403 and an ester of a 1,2-diazonaphthoquinonesulfonyl chloride and a phenol-formaldehyde resin described in U.S. Pat. Nos. 3,046,120 and 3,188,210.

Other o-naphthoquinonediazide compounds known from a large number of patents are also useful. Reference can be made to, e.g., JP-A-47-5303, JP-A-48-63802, JP-A-48-63803, JP-A-48-96575, JP-A-49-38701, JP-A-48-13354, JP-B-37-18015, JP-B-41-11222, JP-B-45-9610, JP-B-49-17481, JP-A-5-11444, JP-A-5-19477, JP-A-5-19478, JP-A-5-107755, U.S. Pat. Nos. 2,797,213, 3,454,400, 3,544,323, 3,573,917, 3,674,495 and 3,785,825, British Patents 1,227, 602, 1,251,345, 1,267,005, 1,329,888 and 1,330,932, and German Patent 854,890.

o-Naphthoquinonediazide compounds obtained by reacting a polyhydroxy compound having a molecular weight of 1,000 or smaller and a 1,2-diazonaphthoquinonesulfonyl chloride are also useful. Reference can be made to JP-A-51-139402, JP-A-58-150948, JP-A-58-203434, JP-A-59-165053, JP-A-60-121445, JP-A-60-134235, JP-A-60-163043, JP-A-61-118744, JP-A-62-10645, JP-A-62-10646, JP-A-62-153950, JP-A-62-178562, JP-A-64-76047, U.S. Pat. Nos. 3,102,809, 3,126,281, 3,130,047, 3,148,983, 3,184,310, 3,188,210, and 4,639,406.

In synthesizing these o-naphthoquinonediazide compounds, the 1,2-diazonaphthoquinonesulfonyl chloride is reacted in an amount of 0.2 to 1.2 equivalent, particularly 0.3 to 1.0 equivalent, to the hydroxyl group of the polyhydroxy compound. The 1,2-diazonaphthoquinonesulfonyl chloride is preferably 1,2-diazonaphthoquinone-5-sulfonyl chloride. 1,2-Diazonaphthoquinone-4-sulfonyl chloride is also useful. The reaction yields a mixture of o-naphthoquinonediazide compounds different in the position and/or amount of the introduced 1,2-diazonaphthoquinonesulfonic ester group. It is preferred for the mixture to contain a completely esterified compound, i.e., a compound with all of its hydroxyl groups esterified with the sulfonic acid group, in a proportion of 5 mol % or more, particularly 20 to 99 mol %.

Positive working photosensitive compounds which can be used in place of the o-naphthoquinonediazide compounds include polymeric compounds having an o-nitrilecarbinol ester group described in JP-B-52-2696, pyridinium-containing compounds (JP-A-4-365049), and diazonium-containing compounds (JP-A-5-249664, JP-A-6-83047, JP-A-6-324495, and JP-A-7-72621).

Compounds generating an acid on photolysis (JP-A-4-121748 and JP-A-4-365043) combined with compounds having a C—O—C group or a C—O—Si group which is released on contact with an acid can also be used. For example, a compound generating an acid on photolysis is combined with an acetal or an O,N-acetal compound (JP-A-48-89003), an orthoester or an amidoacetal compound (JP-A-51-120714), a polymer having an acetal or ketal group in the main chain thereof (JP-A-53-133429), an enol ether compound (JP-A-55-12995, JP-A-4-19748, and JP-A-6-230574), an N-acyliminocarbon compound (JP-A-55-126236), a polymer having an orthoester group in the main chain thereof (JP-A-56-17345), a polymer having a silyl ester group (JP-A-60-10247) or a silyl ether compound (JP-A-60-37549, JP-A-60-121446, JP-A-63-236028, JP-A-63-236029, and JP-A-63-276046).

The above-mentioned positive working photosensitive compounds or combinations are usually used in an amount of 10 to 50% by weight, and preferably 15 to 40% by weight, based on the photosensitive composition.

The o-quinonediazide compound is capable of constituting a photosensitive layer by itself but is preferably used together with a binder resin soluble in an aqueous alkali solution. Such resins soluble in an aqueous alkali solution include novolak resins, such as phenol-formaldehyde resins, m- and/or p-cresol-formaldehyde resins, and phenol/m-, p-, o- or m-/p-/o-mixed cresol-formaldehyde resins. These alkali-soluble resins preferably have a weight average molecular weight of 500 to 100,000.

Resol type phenolic resins are also suitable as a binder. Phenol/m-, p-, o- or m-/p-/o-mixed cresol-formaldehyde resins are preferred. The phenolic resins described in JP-A-61-217034 are especially preferred.

The photosensitive composition can also contain other various alkali-soluble resins, such as a phenol-modified xylene resin, polyhydroxystyrene, poly(halogenated hydroxystyrene), acrylic resins having a phenolic hydroxyl group as disclosed in JP-A-51-34711, vinyl resins or urethane resins having a sulfonamide group disclosed in JP-A-2-866, and vinyl resins having the structural unit described in JP-A-7-28244, JP-A-7-36184, JP-A-7-36185, JP-A-7-248628, JP-A-7-261394, and JP-A-7-333839. In particular, it is preferred that the vinyl resins be film-forming resins comprising at least one kind of units derived from alkali-soluble group-containing monomer groups (1) to (4) shown below.

(1) Acrylamides, methacrylamides, acrylic esters, methacrylic esters and hydroxystyrenes containing an aromatic hydroxyl group, such as N-(4-hydroxyphenyl)acrylamide or N-(4-hydroxyphenyl)methacrylamide, o-, m- or p-hydroxystyrene, o- or m-bromo-p-hydroxystyrene, o- or m-chloro-p-hydroxystyrene, and o-, m- or p-hydroxyphenyl acrylate or methacrylate.

(2) Unsaturated carboxylic acids, such as acrylic acid, methacrylic acid, maleic acid or an anhydride or half ester thereof, and itaconic acid or an anhydride or half ester thereof.

(3) Unsaturated sulfonamides, including acrylamides, such as N-(o-aminosulfonylphenyl)acrylamide, N-(m-aminosulfonyl-phenyl)acrylamide, N-(p-aminosulfonylphenyl)acrylamide, N-[1-(3-aminosulfonyl)naphthyl]acrylamide, and N-(2-aminosulfonylethyl)acrylamide; methacrylamides, such as N-(o-aminosulfonylphenyl)methacrylamide, N-(m-aminosulfonylphenyl)methacrylamide, N-(p-aminosulfonylphenyl)methacrylamide, N-[1-(3-aminosulfonyl)naphthyl]methacrylamide, and N-(2-aminosulfonylethyl)methacrylamide; acrylic esters, such as o-aminosulfonylphenyl acrylate, m-aminosulfonylphenyl acrylate, p-aminosulfonylphenyl acrylate, and 1-(3-aminosulfonylphenylnaphthyl) acrylate; and methacrylic esters, such as o-aminosulfonylphenyl methacrylate, m-aminosulfonylphenyl methacrylate, p-aminosulfonylphenyl methacrylate, and 1-(3-aminosulfonylphenylnaphthyl)methacrylate.

(4) Substituted or unsubstituted phenylsulfonylacrylamides, such as tosylacrylamide, and substituted or unsubstituted phenylsulfonylmethacrylamide, such as tosylmethacrylamide.

The film-forming vinyl resins can further comprise a comonomer unit derived from monomer groups (5) to (14) shown below in addition to the monomers listed above.

(5) (Meth)acrylic esters having an aliphatic hydroxyl group, such as 2-hydroxyethyl (meth)acrylate.
(6) Substituted or unsubstituted acrylic esters, such as methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate, and N-dimethylaminoethyl acrylate.
(7) Substituted or unsubstituted methacrylic esters, such as methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 4-hydroxybutyl methacrylate, glycidyl methacrylate, and N-dimethylaminoethyl methacrylate.
(8) (Meth)acrylamides, such as (meth)acrylamide, N-methylol(meth)acrylamide, N-ethyl(meth)acrylamide, N-hexyl(meth)acrylamide, N-cyclohexyl(meth)acrylamide, N-hydroxyethyl(meth)acrylamide, N-phenyl(meth)acrylamide, N-benzyl(meth)acrylamide, N-nitrophenyl(meth)acrylamide, and N-ethyl-N-phenyl(meth)acrylamide.
(9) Vinyl ethers, such as ethyl vinyl ether, 2-chloroethyl vinyl ether, hydroxyethyl vinyl ether, propyl vinyl ether, butyl vinyl ether, octyl vinyl ether, and phenyl vinyl ether.
(10) Vinyl esters, such as vinyl acetate, vinyl chloroacetate, vinyl butyrate, and vinyl benzoate.
(11) Styrene or derivatives thereof, such as α-methylstyrene, methylstyrene, and chloromethylstyrene.
(12) Vinyl ketones, such as methyl vinyl ketone, ethyl vinyl ketone, propyl vinyl ketone, and phenyl vinyl ketone.
(13) Olefins, such as ethylene, propylene, isobutylene, butadiene, and isoprene.
(14) N-Vinylpyrrolidone, N-vinylcarbazole, 4-vinylpyridine, acrylonitrile, methacrylonitrile, etc.

These alkali-soluble polymers preferably have a weight average molecular weight of 500 to 500,000.

These alkali-soluble polymers can be used either individually or as a combination of two or more thereof. From the standpoint of developing properties and press life, the alkali-soluble polymers are used in a proportion of not more than 99% by weight, preferably 30 to 95% by weight, and more preferably 50 to 95% by weight, based on the photosensitive composition.

It is preferred for obtaining improved ink-receptivity that the photosensitive composition contains a condensate of a phenol substituted with an alkyl group having 3 to 8 carbon atoms and formaldehyde, such as a t-butylphenol-formaldehyde resin or an octylphenol-formaldehyde resin, as described in U.S. Pat. No. 4,123,279 or an o-naphthoquinonediazidesulfonic acid ester of the condensate, such as the one described in JP-A-61-243446.

[Development accelerator]

For improving sensitivity and developing properties, it is preferred to add a cyclic acid anhydride, a phenol compound, and an organic acid to the photosensitive composition as a development accelerator. Suitable cyclic acid anhydrides are described in U.S. Pat. No. 4,115,128, including phthalic anhydride, tetrahydrophthalic anhydride, hexahydrophthalic anhydride, 3,6-endoxy-$\Delta^4$-tetrahydrophthalic anhydride, tetrachlorophthalic anhydride, maleic anhydride, chloromaleic anhydride, α-phenylmaleic anhydride, succinic anhydride, and pyromellitic anhydride. Suitable phenol compounds include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxy-triphenylmethane, and 4,4',3",4"-tetrahydroxy-3,5,3',5'-tetramethyltriphenylmethane. Suitable organic acids are described in JP-A-60-88942 and JP-A-2-96755, including sulfonic acids, sulfinic acids, alkylsulfuric acids, phosphonic acids, phosphoric esters, and carboxylic acids. Specific examples of these acids are p-toluenesulfonic acid, dodecylbenzenesulfonic acids, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluylic acid, 3,4-dimethoxybenzoic acid, phthalic acid, terephthalic acid, 1,4-cyclohexene-2,2-dicarboxylic acid, erucic acid, lauric acid, n-undecanoic acid, ascorbic acid, and amino acids. The content of the development accelerator in the photosensitive composition is preferably 0.05 to 15% by weight, still preferably 0.1 to 5% by weight.

[Development stabilizer]

The photosensitive composition can contain nonionic surface active agents (JP-A-62-251740 and JP-A-4-68355) or amphoteric surface active agents (JP-A-59-121044 and JP-A-4-13149) in order to improve development latitude, i.e., processing stability against developing conditions.

Suitable nonionic surface active agents include sorbitan tristearate, sorbitan monopalmitate, sorbitan trioleate, glycerol monostearate, polyoxyethylene sorbitan monooleate, and polyoxyethylene nonylphenyl ether.

Suitable amphoteric surface active agents include alkyldi(aminoethyl)glycines, alkylpolyaminoethylglycine hydrochlorides, 2-alkyl-N-carboxyethyl-N-hydroxyethyl-imidazoliniumbetaines, N-tetradecyl-N,N-betaines (e.g., Amogen K, produced by Daiichi Kogyo K.K.), and alkylimidazoline compounds (e.g., Levon 15, produced by Sanyo Chemical Industries, Ltd.).

The content of these surface active agents in the photosensitive composition is preferably 0.05 to 15% by weight, an more preferably 0.1 to 5% by weight.

[Print-out agent, dye and others]

The photosensitive composition can contain a print-out agent for providing a visible image upon exposure, a dye as an image-coloring agent, and a filler. Useful dyes include the basic dyes described in JP-A-5-313359, which are made up of a cation having a basic dye skeleton and an organic anion having 10 or more carbon atoms, a sulfo group as a sole exchangeable group, and 1 to 3 hydroxyl groups. The dyes are used in an amount of 0.2 to 5% by weight based on the total composition.

To the photosensitive composition can be added one or more than one compounds which generate a photolysis product capable of interacting with the dyes described in JP-A-5-313359 supra to change the color tone, such as an o-naphthoquinone-diazide-4-sulfonyl halide described in U.S. Pat. No. 3,969,118 (JP-A-50-36209), a trihalomethyl-2-pyrrone or trihalomethyltriazine described in U.S. Pat. No. 4,160,671 (JP-A-53-36223), various o-naphthoquinonediazide compounds described in U.S. Pat. No. 2,038,801 (JP-A-55-62444), and a 2-trihalomethyl-5-aryl-1,3,4-oxadiazole compound described in U.S. Pat. No. 4,279,982 (JP-A-55-77742). Of these compounds those having an absorption at 400 nm can also serve as the above-described yellow dye.

Other dyes can also be used as an image-coloring agent. Suitable dyes, inclusive of salt-forming organic dyes, include oil-soluble dyes and basic dyes, such as Oil Green BG, Oil Blue BOS, and Oil Blue #603 (all produced by Orient Kagaku Kogyo K.K.); Victoria Pure Blue BOH, Victoria Pure Blue NAPS, and Ethyl Violet 6HNAPS (all produced by Hodogaya Chemical Co., Ltd.); Rhodamine B (C.I. 45170B), Malachite Green (C.I. 42000), and Methylene Blue (C.I. 52015).

The photosensitive composition can contain yellow dyes represented by the following formulae (VI), (VII) or (VIII), whose absorbance at 417 nm is 70% or more of that at 436 nm.

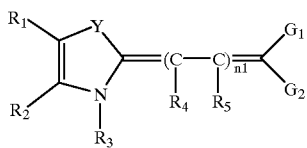

(VI)

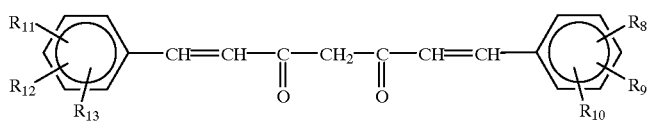

(VIII)

wherein $R_1$ and $R_2$ each represent a hydrogen atom, an alkyl group having 1 to 10 carbon atoms, an aryl group or an alkenyl group, or $R_1$ and $R_2$ may be taken together to form a ring; $R_3$, $R_4$, and $R_5$ each represent a hydrogen atom or an alkyl group having 1 to 10 carbon atoms; $G_1$ and $G_2$ each represent an alkoxycarbonyl group, an aryloxycarbonyl group, an acyl group, an arylcarbonyl group, an alkylthio group, an arylthio group, an alkylsulfonyl group, an arylsulfonyl group or a fluoroalkylsulfonyl group, or $G_1$ and $G_2$ may be taken together to form a ring; at least one of $R_1$, $R_2$, $R_3$, $R_4$, $R_5$, $G_1$, and $G_2$ has at least one of a sulfo group, a carboxyl group, a sulfonamido group, an imido group, an N-sulfonylamido group, a phenolic hydroxyl group, a sulfonimido group, a metal salt of these groups, and an organic or inorganic ammonium salt of these groups; Y represents a divalent atom or atomic group selected from O, S, NR (wherein R represents a hydrogen atom, an alkyl group or an aryl group), Se, —C(CH$_3$)$_2$—, and —CH=CH—; and $n_1$ represents 0 or 1.

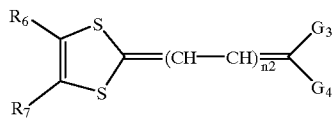

(VII)

wherein $R_6$ and $R_7$ each represent a hydrogen atom, an alkyl group, a substituted alkyl group, an aryl group, a substituted aryl group, a heterocyclic group, a substituted heterocyclic group, an allyl group or a substituted allyl group, or $R_6$ and $R_7$ may be connected to each other to form a ring together with the respective carbon atoms to which they are bonded; $n_2$ represents 0, 1 or 2; $G_3$ and $G_4$ each represent a hydrogen atom, a cyano group, an alkoxycarbonyl group, a substituted alkoxycarbonyl group, an aryloxycarbonyl group, a substituted aryloxycarbonyl group, an acyl group, a substituted acyl group, an arylcarbonyl group, a substituted arylcarbonyl group, an alkylthio group, an arylthio group, an alkylsulfonyl group, an arylsulfonyl group or a fluoroalkylsulfonyl group, provided that $G_3$ and $G_4$ do not represent a hydrogen atom simultaneously; $G_3$ and $G_4$ may be connected to each other to form a ring made up of nonmetallic atoms together with the carbon atom to which they are bonded; and at least one of $R_6$, $R_7$, $G_3$, and $G_4$ has at least one of a sulfo group, a carboxyl group, a sulfonamido group, an imido group, an N-sulfonylamido group, a phenolic hydroxyl group, a sulfonimido group, a metal salt of these groups, and an organic or inorganic ammonium salt of these groups.

wherein $R_8$, $R_9$, $R_{10}$, $R_{11}$, $R_{12}$, and $R_{13}$, which may be the same or different, each represent a hydrogen atom, an alkyl group, a substituted alkyl group, an aryl group, a substituted aryl group, an alkoxy group, a hydroxyl group, an acyl group, a cyano group, an alkoxycarbonyl group, an aryloxycarbonyl group, a nitro group, a carboxyl group, a chlorine atom or a bromine atom.

The photosensitive lithographic printing plate of the present invention is obtained by applying a photosensitive solution of the photosensitive composition in a solvent capable of dissolving each constituent component to the intermediate layer to form a photosensitive layer. Suitable solvents include γ-butyrolactone, ethylene dichloride, cyclohexanone, methyl ethyl ketone, ethylene glycol monomethyl ether, ethylene glycol monoethyl ether, 2-methoxyethyl acetate, 1-methoxy-2-propanol, 1-methoxy-2-propyl acetate, toluene, ethyl acetate, methyl lactate, ethyl lactate, dimethyl sulfoxide, dimethylacetamide, dimethylformamide, water, N-methylpyrrolidone, tetrahydrofurfuryl alcohol, acetone, diacetone alcohol, methanol, ethanol, isopropyl alcohol, and diethylene glycol dimethyl ether. These solvents can be used either individually or as a mixture thereof. The photosensitive solution preferably has a solids content (a concentration of the above-described components) of 2 to 50% by weight. The coating weight preferably ranges from 0.5 g/m$^2$ to 4.0 g/m$^2$. If the coating weight is less than 0.5 g/m$^2$, the lithographic plate has a poor press life. If it exceeds 4.0 g/m$^2$, the press life is extended, but the sensitivity is reduced.

The photosensitive composition can contain surface active agents for improving coating properties. For example, the fluorine-containing surface active agents described in JP-A-62-170950 can be used. The surface active agents are added preferably in an amount of 0.01 to 5% by weight, particularly 0.05 to 1.0% by weight, based on the total composition.

Although the lithographic printing plate thus prepared can produce prints faithful to an original film, there is lack of sharpness on exposure, and the resulting printed matter has roughness. It has been proposed to roughen the surface of the photosensitive layer in order to reduce the lack of sharpness on exposure. For example, JP-A-61-258255 teaches addition of particles of several microns to a photosensitive solution, but this method produces only a small effect in reducing the lack of sharpness with no effect in improving the print roughness.

The method taught in JP-A-50-125805, JP-B-57-6582, JP-B-61-28986, and JP-B-62-62337, which comprises supplying such a component as makes the surface of a photosensitive layer rough, produces appreciable effects on both the lack of sharpness and the print roughness. The improvements are further ensured by incorporating a light absorber having an absorption in the photosensitive wavelength region of the photosensitive layer into a matte layer as proposed in JP-B-55-30619. Thus, satisfactory prints can be obtained even in using an original film obtained by FM screening and an original film having 300 lines/inch which is more liable to cause lack of sharpness on exposure and print roughness than an original film having 175 lines/inch. The roughened surface of the photosensitive layer preferably has such a surface profile that the height of the projections ranges from 1 to 40 $\mu$m, particularly from 2 to 20 $\mu$m, the size (width) of the projections ranges from 10 to 10000 $\mu$m, particularly from 20 to 200 $\mu$m, and the number of projections is from 1 to 1000, particularly 5 to 500, per $mm^2$.

(3) Development treatment

The development treatment of the photosensitive lithographic printing plate of the present invention is explained below.

[Exposure]

The photosensitive lithographic printing plate (precursor) of the present invention is imagewise exposed and developed. Light sources of active light used for exposure include a carbon arc lamp, a mercury lamp, a metal halide lamp, a xenon lamp (pulsed xenon), a tungsten lamp, and a chemical lamp. Radiations include an electron beam, X-rays, an ion beam, and far infrared rays. g-Rays, i-rays, deep-UV rays, and high-density energy beams (laser beams) are also used. Useful lasers include a helium-neon layer, an argon laser, a krypton layer, a helium-cadmium laser, a KrF excimer laser, a semiconductor laser, and a YAG laser.

[Developer]

A preferred developer for developing the photosensitive lithographic printing plate of the invention is an alkaline aqueous solution containing substantially no organic solvent. Examples of suitable developers are aqueous solutions of sodium silicate, potassium silicate, NaOH, KOH, LiOH, sodium tertiary phosphate, sodium secondary phosphate, ammonium tertiary phosphate, ammonium secondary phosphate, sodium metasilicate, sodium carbonate, sodium hydrogencarbonate, potassium carbonate, aqueous ammonia, etc.

A still preferred developer is a solution containing (a) at least one nonreducing saccharide and (b) at least one base and having a pH of 9.0 to 13.5.

This developer will be described in detail hereunder. Unless otherwise noted, the term "developer" as used herein is intended to mean not only a stock solution, with which development is initiated, in the narrow sense of the word but a replenisher.

[Nonreducing saccharide and base]

The developer is characterized in that the main components thereof comprise at least one compound selected from nonreducing saccharides and at least one kind of bases, pH of the solution is in the range of 9.0 to 13.5.

The nonreducing saccharides, which do not carry a free aldehyde or ketone group and do not show reducing property, are classified into trehalose type oligosaccharides in which reducing groups are bonded to each other, glycosides in which the reducing group of a saccharide is bonded to nonsugar, and sugar alcohols obtained by reducing saccharides by hydrogenation, any of which is suitable. The trehalose type oligosaccharides include saccharose and trehalose. The glycosides include alkyl glycosides, phenol glycosides, and mustard oil glycoside. The sugar alcohols include D- or L-arabitol, ribitol, xylitol, D- or L-sorbitol, D- or L-mannitol, D- or L-iditol, D- or L-talitol, dulcitol, and allodulcitol. Maltitol obtained by hydrogenation of a disaccharide and reduced sugar obtained by hydrogenation of oligosaccharides are also suitable. Preferred among them are sugar alcohols and saccharose. In particular, D-sorbitol, saccharose, and reduced sugar are preferred for their buffering action in an appropriate pH range and low price.

These nonreducing saccharides are used either individually or as a combination of two or more thereof. The concentration of the nonreducing saccharide(s) in the developer is preferably 0.1 to 30% by weight, still preferably 1 to 20% by weight. At concentrations lower than 0.1%, a sufficient buffering action is not obtained. Existence of more than 30% of the nonreducing saccharides not only makes the solution difficult to concentrate but incurs an increase of material cost.

If a reducing saccharide is used in combination with a base, the resulting developer turns brown with time, and the pH of the developer decreases gradually, resulting in reduction of developing performance.

The base used in combination with the nonreducing saccharide includes conventional alkali agents. Suitable alkali agents include inorganic ones, such as sodium hydroxide, potassium hydroxide, lithium hydroxide, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, and ammonium borate. Organic alkali agents are also usable, including monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, mooisopropanolamine, diisopropanolamine, ethyleneimine, ethylenediamine, and pyridine.

These alkali agents can be used either individually or as a combination of two or more. Sodium hydroxide and potassium hydroxide are preferred alkali agents because the pH of the developer is adjustable over a broad range by controlling the ratio of these alkali agents to the nonreducing saccharide. Sodium tertiary phosphate, potassium tertiary phosphate, sodium carbonate, and potassium carbonate are also preferred because of their buffering action.

The alkali agent is added in an amount as to adjust the developer to a pH of 9.0 to 13.5, an more preferably 10.0 to 13.2, which amount depends on the desired pH and the kind and amount of the nonreducing saccharide used in combination.

An alkaline buffer solution comprising a weak acid except saccharides and a strong base can be used in combination in the developer. Weak acids having a pKa of 10.0 to 13.2 are preferred for use in the buffer solution. Such weak acids can be selected from those described in literature, such as *Ionization Constants of Organic Acids in Aqueous Solution*, Pergamon Press. Examples of suitable weak acids are shown below. The values in parentheses are pKa values.

Alcohols, such as 2,2,3,3-tetrafluoropropanol-1 (12.74), trifluoroethanol (12.37), and trichloroethanol (12.24);

aldehydes, such as pyridine-2-aldehyde (12.68) and pyridine-4-aldehyde (12.05); compounds having a phenolic hydroxyl group, such as salicylic acid (13.0), 3-hydroxy-2-naphthoic acid (12.84), catechol (12.6), gallic acid (12.4), sulfosalicylic acid (11.7), 34,-dihydroxysulfonic acid (12.2), 3,4-dihydroxybenzoic acid (11.94), 1,2,4-trihydroxybenzene (11.82), hydroquinone (11.56), pyrogallol (11.34), o-cresol (10.33), resorcinol (11.27), p-cresol (10.27), and m-cresol (10.09); oximes, such as 2-butanone oxime (12.45), acetoxime (12.42), 1,2-cycloheptanedione dioxime (12.3), 2-hydroxybenzaldoxime (12.10), dimethylglyoxime (11.9), ethanediamide dioxime (11.37), and acetophenone oxime (11.35); nucleic acid-related substances, such as adenosine (12.56), inosine (12.5), guanine (12.3), cytosine (12.2), hypoxanthine (12.1), and xanthine (11.9); and other weak acids, such as diethylaminomethylphosphonic acid (12.32), 1-amino-3,3,3-trifluorobenzoic acid (12.29), isopropylidenediphosphonic acid (12.10), 1,1-ethylidenediphosphonic acid (11.54), 1-hydroxy-1,1-ethylidenediphosphonic acid (11.52), benzimidazole (12.86), thiobenzamide (12.8), picoline thioamide (12.55), and barbituric acid (12.5). Preferred of these weak acids are sulfosalicylic acid and salicylic acid.

The bases which are suitably combined with the weak acids include sodium hydroxide, ammonium hydroxide, potassium hydroxide, and lithium hydroxide. These bases can be used either individually or as a combination of two or more thereof. The concentration and combination of the bases are selected appropriately so as to adjust the pH of the developer within a desired range.

[Surface active agent]

If desired, the developer can contain various surface active agents and organic solvents to accelerate development, to disperse scum, or to increase ink-receptivity of the image area of the printing plate. Anionic, cationic, nonionic or amphoteric surface active agents can be used.

Examples of suitable nonionic surface active agents are polyoxyethylene alkyl ethers, polyoxyethylene alkylphenyl ethers, polyoxyethylene polystyrylphenyl ether, polyoxyethylene-polyoxypropylene alkyl ethers, partial fatty acid esters of glycerol, partial fatty acid esters of sorbitan, partial fatty acid esters of pentaerythritol, propylene glycol mono-fatty acid esters, partial fatty acid esters of sucrose, partial fatty acid esters of polyoxyethylene sorbitan, partial fatty acid esters of polyoxyethylene sorbitol, polyethylene glycol fatty acid esters, partial fatty acid esters of polyglycerol, polyoxyethylene castor oil, partial fatty acid esters of polyoxyethylene glycerol, fatty acid diethanolamides, N,N-bis-2-hydroxyalkylamines, polyoxyethylenealkylamines, triethanolamine fatty acid esters, and trialkylamine oxides.

Examples of suitable anionic surface active agents are fatty acid salts, abietic acid salts, hydroxyalkanesulfonic acid salts, alkanesulfonic acid salts, dialkylsulfosuccinic ester salts, (straight-chain)alkylbenzenesulfonic acid salts, (branched)alkylbenzenesulfonic acid salts, alkylnaphthalenesulfonic acid salts, alkylphenoxypolyoxyethylenepropylsulfonic acid salts, polyoxyethylene alkylsulfophenyl ether salts, N-methyl-N-oleyltaurine sodium salt, N-alkylsulfosuccinic monoamide disodium salts, petroleum sulfonic acid salts, sulfurized beef tallow oil, sulfuric ester salts of fatty acid alkyl esters, alkylsulfuric ester salts, polyoxyethylene alkyl ether sulfuric ester salts, sulfuric ester salts of glycerol mono-fatty acid esters, polyoxyethylene alkylphenyl ether sulfuric ester salts, polyoxyethylene styrylphenyl ether sulfuric ester salts, alkylphosphoric ester salts, polyoxyethylene alkyl ether phosphoric ester salts, polyoxyethylene alkylphenyl ether phosphoric ester salts, partially saponified styrene-maleic anhydride copolymers, partially saponified olefin-maleic anhydride copolymers, and naphthalenesulfonic acid salt-formalin condensates.

Examples of suitable cationic surface active agents are alkylamine salts, quaternary ammonium salts (e.g., tetrabutyl-ammonium bromide), polyoxyethylenealkylamine salts, and polyethylene polyamine derivatives.

Examples of suitable amphoteric surface active agents are carboxybetaines, aminocarboxylic acids, sulfobetaines, aminosulfuric esters, and imidazoline derivatives.

The term "polyoxyethylene" appearing in the above-listed surface active agents can be replaced with other polyoxyalkylenes, such as polyoxymethylene, polyoxypropylene, and polyoxybutylene.

Still preferred surface active agents are fluorine-containing ones which contain a perfluoroalkyl group in the molecule thereof. Such fluorine-containing surface active agents include anionic type compounds, such as perfluoroalkylcarboxylic acid salts, perfluoroalkylsulfonic acid salts, and perfluoroalkylphosphoric esters; amphoteric type compounds, such as perfluoroalkylbetaines; cationic type compounds, such as perfluoroalkyltrimethylammonium salts; and nonionic type compounds, such as perfluoroalkylamine oxides, perfluoroalkyl ethylene oxide adducts, oligomers containing a perfluoroalkyl group and a hydrophilic group, oligomers containing a perfluoroalkyl group and a lipophilic group, oligomers containing a perfluoroalkyl group, a hydrophilic group, and a lipophilic group, and urethane containing a perfluoroalkyl group and a lipophilic group.

These surface active agents can be used either individually or as a combination of two or more thereof. They are added to the developer in a concentration of 0.001 to 10% by weight, and preferably 0.01 to 5% by weight.

[Development stabilizer]

The developer can contain various development stabilizers. Suitable development stabilizers include those described in JP-A-6-282079, such as polyethylene glycol adducts of sugar alcohols, tetraalkylammonium salts, e.g., tetrabutylammonium hydroxide, phosphonium salts, e.g., tetrabutylphosphonium bromide, and iodonium salts, e.g., diphenyliodonium chloride.

Other useful development stabilizers include the anionic or amphoteric surface active agents described in JP-A-50-51324, the water-soluble cationic polymers described in JP-A-55-95946, the water-soluble amphoteric polyelectrolytes described in JP-A-56-142528, the alkylene glycol-added organic boron compounds described in JP-A-59-84241, the polyoxyethylene-polyoxypropylene block polymer type water-soluble surface active agents described in JP-A-60-111246, the (polyoxyethylene-polyoxypropylene)-substitutedalkylenediamine compounds described in JP-A-60-129750, polyethylene glycol having a weight average molecular weight of 300 or more as described in JP-A-61-215554, fluorine-containing surface active agents having a cationic group as described in JP-A-63-175858, water-soluble ethylene oxide adducts obtained by adding 4 mol or more of ethylene oxide to an acid or an alcohol as described in JP-A-2-39157, and water-soluble polyalkylene compounds.

[Organic solvent]

While the developer used in the present invention contains substantially no organic solvent as stated above, an organic solvent may be added if necessary. A suitable organic solvent to be added is chosen from among those having a water solubility of about 10% by weight or less, and preferably 5% by weight or less. Examples of such organic solvents are 1-phenylethanol, 2-phenylethanol, 3-phenyl-1-propanol, 4-phenyl-1-butanol, 4-phenyl-2-butanol, 2-phenyl-1-butanol, 2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 3-methylcyclohexanol, 4-methylcyclohexanol, N-phenylethanolamine, and N-phenyldiethanolamine. The language "the developer contains substantially no organic solvent" as mentioned above means that the content of an organic solvent, if any, is not more than 5% by weight based on the total weight of the running developer. The amount of the organic solvent is closely related to the amount of a surface active agent. As the organic solvent increases in amount, it is preferred to increase the amount of the surface active agent. If an organic solvent is used in an increased amount without increasing the surface active agent, the organic solvent does not dissolve completely, failing to secure satisfactory developing properties.

[Reducing agent]

The developer can contain a reducing agent for the purpose of preventing scumming development on the printing plate. Addition of a reducing agent is particularly effective in developing a negative working photosensitive lithographic printing plate containing a photosensitive diazonium salt compound in its photosensitive layer. Preferred organic reducing agents include phenolic compounds, such as thiosalicylic acid, hydroquinone, Methol, methoxyquinone, resorcin, and 2-methylresorcin; and amine compounds, such as phenylenediamine and phenylhydrazine. Preferred inorganic reducing agents include a sodium salt, a potassium salt, an ammonium salt, etc. of sulfurous acid, a hydrogensulfite, phosphorous acid, a hydrogenphosphite, a primary phosphite, thiosulfuric acid, dithionous acid, etc. Of these reducing agents sulfites are particularly effective for prevention of scumming development. The reducing agent is preferably used in a concentration of 0.05 to 5% by weight based on the running developer.

[Organic carboxylic acid]

The developer can contain an organic carboxylic acid, preferably an aliphatic or aromatic carboxylic acid having 6 to 20 carbon atoms. Examples of suitable aliphatic carboxylic acids are caproic acid, enanthylic acid, caprylic acid, lauric acid, myristic acid, palmitic acid, and stearic acid, with alkanoic acids having 8 to 12 carbon atoms being particularly preferred. The aliphatic carboxylic acids may be unsaturated ones having a double bond in the carbon chain or may have a branched carbon chain.

The aromatic carboxylic acids are compounds having a benzene ring, a naphthalene ring, an anthracene ring, etc. which is substituted with a carboxyl group. Examples of suitable aromatic carboxylic acids are o-chlorobenzoic acid, p-chlorobenzoic acid, o-hydroxybenzoic acid, p-hydroxybenzoic acid, o-aminobenzoic acid, p-aminobenzoic acid, 2,4-dihydroxybenzoic acid, 2,5-dihydroxybenzoic acid, 2,6-dihydroxybenzoic acid, 2,3-dihydroxybenzoic acid, 3,5-dihydroxybenzoic acid, gallic acid, 1-hydroxy-2-naphthoic acid, 3-hydroxy-2-naphthoic acid, 2-hydroxy-1-naphthoic acid, 1-naphthoic acid, and 2-naphthoic acid, with hydroxynaphthoic acid being particularly effective.

The aliphatic or aromatic carboxylic acid is preferably used in the form of its sodium, potassium or ammonium salt, which has improved water solubility over the free form. While the organic carboxylic acid content in the developer is not particularly limited, a concentration lower than 0.1% by weight produces little effect, and a concentration higher than 10% by weight produces no further improvement and can rather interfere with dissolution of other additives. Accordingly, a preferred concentration ranges from 0.1 to 10% by weight, particularly 0.5 to 4% by weight, in the running developer.

[Others]

The developer may further contain other various additives, such as preservatives, coloring agents, thickeners, defoaming agents, water softeners, and the like. Suitable water softeners include polyphosphoric acid and a sodium, potassium or ammonium salt thereof; aminopolycarboxylic acids, such as ethylenediaminetetraacetic acid, diethylenetriaminepentaacetic acid, triethylenetetraminehexaacetic acid, hydroxyethylethylenediaminetriacetic acid, nitrilotriacetic acid, 1,2-diaminocyclohexanetetraacetic acid, and 1,3-diamino-2-propanoltetraacetic acid, and a sodium, potassium or ammonium salt thereof; aminotri (methylenephosphonic acid), ethylenediaminetetra (methylenephosphonic acid), diethylenetriaminepenta (methylenephosphonic acid), triethylenetetraminehexa (methylenephosphonic acid), hydroxyethylethylenediaminetri(methylenephosphonic acid), and 1-hydroxyethane-1,1-diphosphonic acid, and a sodium, potassium or ammonium salt thereof.

The optimum amount of the water softener to be added varies depending on its chelating ability and the hardness and amount of hard water used. It generally ranges from 0.01 to 5% by weight, and preferably 0.01 to 0.5% by weight, based on the running developer. The expected effect is not exerted at lower concentrations. At higher concentrations, adverse effects, such as clear image, can result.

The developer is made up of the above-described components and water. It is advantageous for efficient transportation that the developer be a concentrate having a reduced water content and be diluted with water on use. The degree of concentration should be such that each component may not be separated or precipitated.

In addition to the above-mentioned developer, the developer described in JP-A-6-282079 is also usable in the present invention, which comprises an alkali metal silicate having an $SiO_2/M_2O$ (M is an alkali metal) molar ratio of 0.5 to 2.0 and a water-soluble ethylene oxide adduct obtained by adding 5 mol or more of ethylene oxide to a sugar alcohol having 4 or more hydroxyl groups. The sugar alcohol is a polyhydric alcohol corresponding to a saccharide with its aldehyde group and ketone group reduced to a primary alcohol group and a secondary alcohol group, respectively. Specific examples of the sugar alcohol are D- or L-threitol, erythritol, D- or L-arabitol, ribitol, xylitol, D- or L-sorbitol, D- or L-mannitol, D- or L-iditol, D- or L-talitol, dulcitol, and allodulcitol. Such condensed sugar alcohols as di-, tri-, tetra-, penta- and hexaglycerol are also useful. The water-soluble ethylene oxide adduct is obtained by addition reaction of 5 mol or more of ethylene oxide per mole of the sugar alcohol. If desired, propylene oxide may be block copolymerized with the ethylene oxide adduct as far as the solubility is within a permissible range. The ethylene oxide adducts may be used either individually or as a combination of two or more thereof.

The water-soluble ethylene oxide adduct is preferably added in an concentration of 0.001 to 5% by weight, and preferably 0.001 to 2% by weight, based on the running developer.

In order to accelerate development, to disperse scum, or to increase ink-receptivity of the image area, this developer can also contain various surface active agents or organic solvents as previously described.

[development and post-treatment]

The PS plate having been processed with the above-described developer is then subjected to post-treatments with washing water, a rinsing solution containing a surface active agent, etc., and a finisher or protective gum solution mainly comprising gum arabic, a starch derivative, etc. These post-treatments are appropriately combined.

In recent platemaking and printing industries, an automatic processing machine for presensitized plates (PS plate) is used widely for rationalization and standardization. The automatic processing machine is generally divided into a developing part and a post-treating part each comprising a PS plate carrying unit, a processing tank, and a spraying unit, in which each processing solution is pumped up and sprayed onto an exposed PS plate while being carried horizontally to conduct development and post-treatment. A method in which a PS plate is passed through a processing tank filled with a processing solution by means of submerged guide rolls and a method in which a small given amount of water is supplied to a developed plate to conduct washing, and the waste water is reused for dilution of the developer concentrate have come to be known recently.

In such automatic processing, the processing solutions can be replenished with respective replenishers in accordance with the processing capacity and the working time of the processing solutions. A throwaway processing system using substantially unused processing solutions is also applicable. The thus prepared lithographic printing plate is mounted on an offset printing machine for obtaining a large number of prints.

As described above, the present invention provides a positive working photosensitive lithographic printing plate excellent in every respect of resistance to staining on being left to stand, press life, deletion properties, freedom from color remaining, print-out properties, and chemical resistance. The positive working photosensitive lithographic printing plate of the present invention exhibits these excellent properties even when the precursor thereof is developed with a developer containing no silicate.

The present invention will now be illustrated in greater detail with reference to Examples, but it should be understood that the present invention is by no means limited thereto. Unless otherwise noted, all the percents and parts are given by weight.

EXAMPLES 1 TO 4 AND COMPARATIVE EXAMPLES 1 TO 5

The surface of a 0.24 mm thick aluminum plate (JIS A1050) was grained with a nylon brush and an aqueous slurry of 400 mesh pumice stone powder, followed by washing with water thoroughly. The aluminum plate was chemically etched by immersion in a 10% sodium hydroxide aqueous solution at 70° C. for 60 seconds, followed by washing with running water. The plate surface was neutralized by washing with a 20% nitric acid aqueous solution and washed with water. The surface of the aluminum plate was further grained electrolytically in a 1% nitric acid aqueous solution using an alternating sinusoidal current at $V_A$=12.7 V and at an anodic electricity quantity of 260 C/dm². The resulting surface had an average center-line roughness (Ra) of 0.55 µm. The plate was immersed in a 30% sulfuric acid aqueous solution at 55° C. for 2 minutes for desmutting. Then the plate was anodized in a 20% sulfuric acid aqueous solution at a current density of 14 A/dm² to form 2.5 g/m² of an anodized layer, followed by washing with water to prepare substrate A.

Substrate A was treated with a 2.5% sodium silicate aqueous solution at 30° C. for 10 seconds and washed with water to obtain substrate B.

A solution of 0.3 g of the polymer shown in Table 1 below in a mixed solvent of 100 g of methanol and 1 g of water was applied to the surface of substrate A or B thus treated to a dry coating weight of 15 mg/m² and dried at 80° C. for 15 seconds to form an intermediate layer.

Photosensitive solution (A) having the following formulation was applied to the intermediate layer to a dry coating weight of 1.3 g/m² and dried to form a photosensitive layer.

In order to shorten the time required for vacuum contact, a matte layer was formed on the photosensitive layer in accordance with the method described in JP-B-61-28986, thereby producing photosensitive lithographic printing plates (Examples 1 to 4).

For comparison, photosensitive lithographic printing plates were prepared in the same manner as described above, except that photosensitive solution (A) was applied directly to substrate A (Comparative Examples 1 and 2) or substrate B (Comparative Example 3), or except that the polymer of the intermediate layer was replaced with β-alanine (Comparative Examples 4 and 5).

Formulation of Photosensitive Solution (A):

| | |
|---|---|
| Ester of 1,2-diazonaphthoquinone-5-sulfonyl chloride and pyrogallol-acetone resin (the compound described in Example 1 of U.S. Pat. No. 3,635,709) | 0.8 g |
| Binder: | |
| Novolak I* | 1.5 g |
| Novolak II* | 0.2 g |
| Resin III* other than novolak | 0.4 g |
| p-n-octylphenol-formaldehyde resin (the resin described in U.S. Pat. No. 4,123,279) | 0.02 g |
| Naphthoquinone-1,2-diazido-4-sulfonyl chloride | 0.01 g |
| Tetrahydrophthalic anhydride | 0.02 g |
| Benzoic acid | 0.02 g |
| Pyrogallol | 0.05 g |
| 4-[p-N,N-Bis(ethoxycarbonylmethyl)-aminophenyl]-2,6-bis(trichloromethyl)-S-triazine (hereinafter referred to as triazine A) | 0.07 g |
| Victoria Pure Blue BOH (counter anion: | 0.045 g |

-continued

| | |
|---|---|
| 1-naphthalenesulfonate; a product of Hodogaya Chemical Co., Ltd.) | |
| Fluorine-containing surface active agent (F176PF, produced by Dainippon Ink & Chemicals, Inc.) | 0.01 g |
| Methyl ethyl ketone | 15 g |
| 1-Methoxy-2-propanol | 10 g |

*:
Novolak (I)

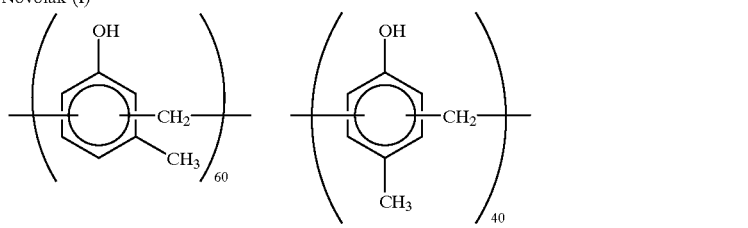

Mw: 8000

Novolak (II)

Mw: 15,000

Resin (III) other than novolak

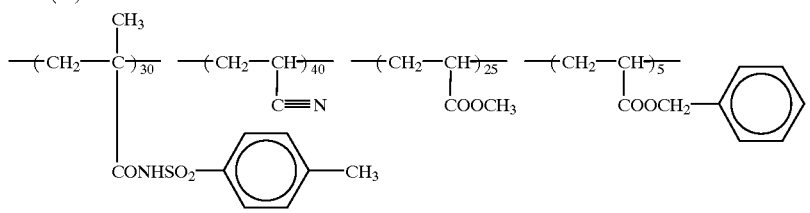

Mw: 50,000

Each photosensitive lithographic printing plate was imagewise exposed to light of a 3 kW metal halide lamp 1 m distant from the plate for 1 minute and developed with Developer (A) or (B) having the following formulation at 30° C. for 12 seconds by means of PS Processor 900 VR (manufactured by Fuji Photo Film Co., Ltd.).

Formulation of Developer (A):

| | |
|---|---|
| D-Sorbitol | 5.1 parts |
| Sodium hydroxide | 1.1 part |
| Triethanolamine-ethylene oxide (30 mol) adduct | 0.03 part |
| Water | 93.8 parts |

Formulation of Developer (B):

| | |
|---|---|
| Sodium silicate aqueous solution (SiO$_2$/Na$_2$O molar ratio: 1.2; SiO$_2$ content: 1.4%) | 100 parts |
| Ethylenediamine-ethylene oxide (30 mol) adduct | 0.03 part |

After the development processing, the unnecessary image area was deleted with a deletion fluid (RP-2, produced by Fuji Photo Film Co., Ltd.) and washed with water. Deletion properties were evaluated by observing indistinguishability of the deleted area from the non-image area with the naked eye and rated as follows.

AA . . . No color difference is observed between the deleted area and the non-image area.

A . . . A color difference is hardly observed between the deleted area and the non-image area.

B . . . The deleted area looks slightly darker than the non-image area.

C . . . The deleted area looks apparently darker than the non-image area.

D . . . The deleted area looks apparently dirtier than the non-image area.

Color remaining on the non-image area was evaluated by observing a density difference between the non-image area and the substrate before being coated and rated as follows.

AA . . . No color difference is observed between the non-image area and the substrate before being coated.

A . . . A color difference is hardly observed between the non-image area and the substrate before being coated.

B . . . The non-image area looks slightly darker than the substrate before being coated.

C . . . The non-image area looks apparently darker than the substrate before being coated.

D . . . The non-image area looks extremely darker than the substrate before being coated.

Resistance of the printing plate against staining with ink on being left to stand was evaluated as follows. Printing was conducted on a printing machine (SOR-M manufactured by Heidel) until 2000 prints were obtained. The plate was removed from the printing machine. After 60 minutes, printing was resumed, and the prints produced were observed to see how the ink on the non-image area was being removed. The result of the observation was rated as follows.

A . . . The ink on the non-image area is removed soon.
B . . . It takes some time for the ink on the non-image area to be removed.
C . . . It takes a significant amount of for the ink on the non-image area to be removed.
D . . . It takes considerably more time for the ink on the non-image area to be removed.

In order to evaluate print-out properties, the optical density of the photosensitive layer was measured before exposure and after exposure with a Macbeth densitometer to obtain a different in optical density ($\Delta D$). The greater the difference in optical density made by exposure, the more clearly is distinguishable the exposed area from the unexposed area.

Chemical resistance of the printing plate was evaluated by the number of satisfactory prints that the printing plate can produce when printing was carried out on a printing machine manufactured by Komori Insatsuki K.K. while wiping the solid image area of the plate with a plate cleaner (CL-2, produced by Fuji Photo Film Co., Ltd.) for every 5,000 prints. The greater the number of prints, the more satisfactory the chemical resistance.

Further, printing was carried on under the same conditions as in the evaluation of chemical resistance but without wiping with a plate cleaner. The number of prints obtained with satisfactory print quality was taken as a press life.

The results of these evaluations are shown in Table 1.

EXAMPLES 5 TO 10 AND COMPARATIVE EXAMPLES 6 TO 10

The surface of a 0.24 mm thick aluminum plate (JIS A1050) was grained with a nylon brush and an aqueous slurry of 400 mesh pumice stone powder, followed by washing with water thoroughly. The aluminum plate was chemically etched by immersion in a 10% sodium hydroxide aqueous solution at 70° C. for 60 seconds, followed by washing with running water. The plate surface was neutralized by washing with a 20% nitric acid aqueous solution and washed with water. The surface of the aluminum plate was further grained electrolytically in a 1% nitric acid aqueous solution using an alternating sinusoidal current at $V_A$=12.7 V and at an anodic electricity quantity of 260 C/dm$^2$. The resulting surface had an average center-line roughness (Ra) of 0.55 $\mu$m. The plate was immersed in a 30% sulfuric acid aqueous solution at 55° C. for 2 minutes for desmutting. Then the plate was anodized in a 20% sulfuric acid aqueous solution at a current density of 14 A/dm$^2$ to form 2.5 g/m$^2$ of an anodized layer, followed by washing with water to prepare substrate A.

Substrate A was treated with a 0.001% sodium silicate aqueous solution at 30° C. for 10 seconds and washed with water to prepare substrate C.

A solution of 0.3 g of the polymer shown in Table 1 below in a mixed solvent of 90 g of methanol, 10 g of ethanol, and 1 g of water was applied to substrate C to a dry coating weight of 15 mg/m$^2$ and dried at 80° C. for 15 seconds to form an intermediate layer.

Photosensitive solution (B) having the following formulation was applied to the intermediate layer to a dry coating weight of 1.8 g/m$^2$ and dried to form a photosensitive layer.

In order to shorten the time required for vacuum contact, a matte layer was formed on the photosensitive layer in accordance with the method described in JP-B-61-28986, thereby producing photosensitive lithographic printing plates (Examples 5 to 8).

For comparison, photosensitive lithographic printing plates were prepared in the same manner as described above, except that photosensitive solution (B) was applied directly to substrate A (Comparative Examples 6 and 7) or substrate C (Comparative Example 8). Further, photosensitive lithographic printing plates were prepared in the same manner as described above, except for using substrate C or substrate A and replacing the polymer of the intermediate layer with triethanolamine hydrochloride (Comparative Examples 9 and 10).

Formulation of Photosensitive Solution (B):

| | |
|---|---|
| Ester of 1,2-diazonaphthoquinone-5-sulfonyl chloride and pyrogallol-acetone resin (the compound described in Example 1 of U.S. Pat. No. 3,635,709) | 0.9 g |
| Binder: | |
| Novolak IV* | 1.60 g |
| Novolak V* | 0.3 g |
| p-n-Octylphenol-formaldehyde resin (the resin described in U.S. Pat. No. 4,123,279) | 0.02 g |
| Naphthoquinone-1,2-diazido-4-sulfonyl chloride | 0.01 g |
| Ester of 1,2-diazonaphthoquinone-5 sulfonyl chloride and pyrogallol-acetone resin (the compound described in Example 1 of U.S. Pat. No. 3,635,709) | 0.9 g |
| Binder: | |
| Novolak IV* | 1.60 g |
| Novolak V | 0.3 g |
| p-n-Octylphenol-formaldehyde resin (the resin described in U.S. Pat. No. 4,123,279) | 0.02 g |
| Naphthoquinone-1,2-diazido-4-sulfonyl chloride | 0.01 g |
| Tetrahydrophthalic anhydride | 0.02 g |
| Benzoic acid | 0.02 g |
| Pyrogallol | 0.05 g |
| Triazine A | 0.07 g |
| Victoria Pure Blue BOH (counter anion: 1-naphthalenesulfonate; a product of of Hodogaya Chemical Co., Ltd.) | 0.10 g |
| Fluorine-containing surface active agent (F176PF, produced by Dainippon Ink & Chemicals, Inc.) | 0.06 g |
| Methyl ethyl ketone | 12.0 g |

\*:
Novolak IV: Mw: 3,000

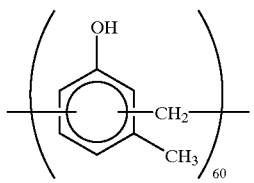 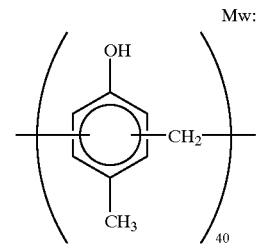

-continued

Novolak V: Mw: 1700

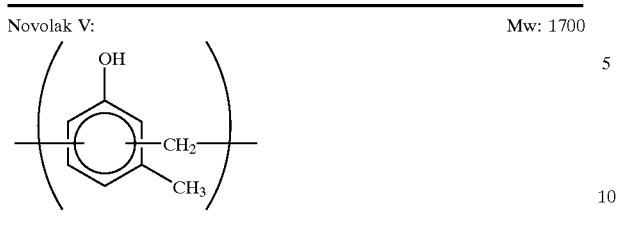

Furthermore, photosensitive lithographic printing plates were prepared in the same manner as in Examples 5 to 8, except that the polymer of the intermediate layer was replaced with the polymer shown in Table 1 and that Photosensitive Solution (C) having the following formulation was applied on the intermediate layer (Examples 9 and 10).

Formulation of Photosensitive Solution (C):

| | |
|---|---|
| Ester of 1,2-diazonaphthoquinone-5-sulfonyl chloride and 2,3,4-trihydroxy-benzophenone (degree of esterification: 90%) | 0.6 g |
| N-(p-Aminosulfonylphenyl)methacrylamide-acrylonitrile-methyl methacrylate copolymer (45/30/25 by mole; Mw: 75,000) | 1.7 g |
| Novolak IV | 0.7 g |
| Tetrahydrophthalic anhydride | 0.05 g |
| Triazine A | 0.07 g |
| Victoria Pure Blue BOH (counter anion: 1-naphthalenesulfonate; a product of Hodogaya Chemical Co., Ltd.) | 0.05 g |
| Fluorine-containing surface active agent (F176PF, produced by Dainippon Ink & Chemicals, Inc.) | 0.06 g |
| γ-Butyrolactone | 8.0 g |
| Methyl ethyl ketone | 12.0 g |
| 1-Methoxy-2-propanol | 10.0 g |

Each of the resulting photosensitive lithographic printing plates was imagewise exposed in the same manner as in Example 1 and developed with developer (A) or (B) in the same manner as in Example 1.

The developed plate was evaluated in terms of deletion properties, color remaining, staining on being allowed to stand, print-out properties, press life, and chemical resistance in the same manner as in Example 1. The results obtained are shown in Table 1.

COMPARATIVE EXAMPLE 11

A lithographic printing plate was prepared in the same manner as in Example 1, except for using comparative polymer 1 in the intermediate layer. The results of evaluations are shown in Table 1.

Comparative Polymer 1:

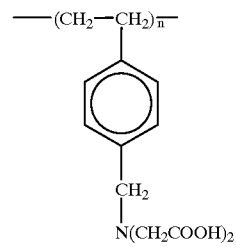

(Rf: 0.01 on alumina and 0.76 on silica)

COMPARATIVE EXAMPLE 12

A lithographic printing plate was prepared in the same manner as in Example 8, except for using comparative polymer 2 in the intermediate layer. The results of evaluations are shown in Table 1.

Comparative Polymer 2:

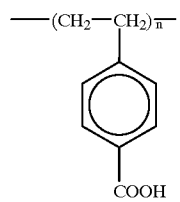

(Rf: 0.07 on alumina and 0.80 on silica)

COMPARATIVE EXAMPLES 13

A lithographic printing plate was prepared in the same manner as in Example 10, except for using comparative polymer 3 in the intermediate layer. The results of evaluations are shown in Table 1.

Comparative Polymer 3:

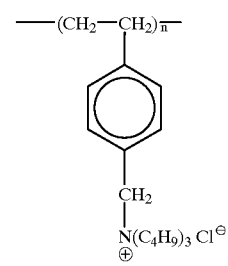

(Rf: 0.75 on alumina and 0.52 on silica)

TABLE 1

| Example No. | Substrate | Polymer | Rf (on alumina) | Rf (on silica) | Photo-sensitive Layer | Developer | Deletion Properties | Color Remaining | Staining on Being Left | Print-out Properties (ΔD) | Press Life | Chemical Resistance |
|---|---|---|---|---|---|---|---|---|---|---|---|---|
| Ex. 1 | B | No. 1 | 0.07 | 0.06 | (A) | (A) | AA | AA | A | 0.18 | 220000 | 220000 |
| Ex. 2 | B | No. 9 | 0.02 | 0.03 | (A) | (A) | A | A | A | 0.18 | 190000 | 170000 |
| Ex. 3 | B | No. 19 | 0.10 | 0.09 | (A) | (A) | A | A | A | 0.18 | 180000 | 160000 |
| Ex. 4 | B | No. 6 | 0.07 | 0.02 | (A) | (B) | A | A | A | 0.18 | 210000 | 190000 |
| Comp. Ex. | B | comparative polymer 1 | 0.01 | 0.76 | (A) | (A) | C | B | A | 0.13 | 110000 | 90000 |
| Comp. Ex. 1 | A | none | — | — | (A) | (A) | D | B | D | 0.12 | 200000 | 200000 |
| Comp. Ex. 2 | A | none | — | — | (A) | (B) | D | C | B | 0.12 | 200000 | 190000 |
| Comp. Ex. 3 | B | none | — | — | (A) | (A) | D | D | A | 0.12 | 30000 | 10000 |
| Comp. Ex. 4 | B | β-alanine | — | — | (A) | (A) | C | C | A | 0.11 | 50000 | 30000 |
| Comp. Ex. 5 | B | β-alanine | — | — | (A) | (B) | C | C | A | 0.11 | 40000 | 30000 |
| Ex. 5 | C | No. 2 | 0.07 | 0.08 | (B) | (A) | AA | AA | A | 0.18 | 220000 | 210000 |
| Ex. 6 | C | No. 4 | 0.07 | 0.03 | (B) | (A) | A | A | A | 0.17 | 190000 | 170000 |
| Ex. 7 | C | No. 26 | 0.13 | 0.08 | (B) | (A) | A | A | A | 0.17 | 180000 | 170000 |
| Ex. 8 | C | No. 23 | 0.16 | 0.05 | (B) | (B) | AA | A | A | 0.18 | 190000 | 170000 |
| Ex. 9 | C | No. 2 | 0.07 | 0.08 | (C) | (A) | A | A | A | 0.18 | 240000 | 220000 |
| Ex. 10 | C | No. 26 | 0.13 | 0.08 | (C) | (B) | A | A | A | 0.17 | 220000 | 210000 |
| Comp. Ex. 12 | C | comparative polymer 2 | 0.07 | 0.80 | (B) | (B) | C | A | A | 0.12 | 150000 | 120000 |
| Comp. Ex. 13 | C | comparative polymer 3 | 0.75 | 0.52 | (C) | (B) | C | B | A | 0.18 | 160000 | 100000 |
| Comp. Ex. 6 | A | none | — | — | (B) | (A) | D | A | D | 0.12 | 200000 | 200000 |
| Comp. Ex. 7 | A | none | — | — | (B) | (B) | C | B | B | 0.12 | 200000 | 190000 |
| Comp. Ex. 8 | C | none | — | — | (B) | (A) | C | C | A | 0.12 | 30000 | 10000 |
| Comp. Ex. 9 | C | triethanolamine hydrochloride | — | — | (B) | (A) | B | C | A | 0.10 | 60000 | 40000 |
| Comp. Ex. 10 | A | triethanolamine hydrochloride | — | — | (B) | (B) | B | B | B | 0.10 | 180000 | 120000 |

It is seen from the results in Table 1 that the photosensitive lithographic printing plate according to the present invention is excellent in every respect of resistance to staining on being left to stand, press life, deletion properties, freedom from color remaining, print-out properties, and chemical resistance.

While the invention has been described in detail and with reference to specific examples thereof, it will be apparent to one skilled in the art that various changes and modifications can be made therein without departing from the spirit and scope thereof.

What is claimed is:

1. A positive working photosensitive lithographic printing plate comprising an aluminum substrate and a positive working photosensitive layer, said aluminum substrate having been anodized and rendered water-wettable and thereby having on its surface an alumina layer and a water-wettable layer, wherein an intermediate layer containing a polymer comprising (A) a unit having an acid radical interacting with said alumina layer and (B) a unit interacting with said water-wettable layer is provided between said aluminum substrate and said photosensitive layer.

2. A positive working photosensitive lithographic printing plate according to claim 1 wherein said unit interacting with said alumina layer is a unit having an acid radical selected from the group consisting of —COOH, —SO$_3$H, —OSO$_3$H, —PO$_3$H$_2$, —OPO$_3$H$_2$, —CONHSO$_2$, and —SO$_2$NHSO$_2$.

* * * * *